United States Patent
Derat et al.

(10) Patent No.: US 11,990,928 B2
(45) Date of Patent: May 21, 2024

(54) SAR MEASUREMENT FOR A COMBINED 5G AND LTE RF DEVICE

(71) Applicant: Rohde & Schwarz GmbH & Co. KG, Munich (DE)

(72) Inventors: Benoit Derat, Munich (DE); Michael Herchel, Munich (DE); Christian Dobmeier, Germering (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 948 days.

(21) Appl. No.: 16/995,457

(22) Filed: Aug. 17, 2020

(65) Prior Publication Data

US 2021/0080523 A1    Mar. 18, 2021

(30) Foreign Application Priority Data

Sep. 18, 2019    (EP) ..................................... 19197946

(51) Int. Cl.
    *H04B 1/3827*      (2015.01)
    *G01R 29/08*      (2006.01)

(52) U.S. Cl.
    CPC ........... *H04B 1/3838* (2013.01); *G01R 29/08* (2013.01)

(58) Field of Classification Search
    CPC .. H04B 17/318; H04B 17/3913; H04B 7/155; H04B 1/1027; H04B 17/17; H04B 17/18;
(Continued)

(56) References Cited

U.S. PATENT DOCUMENTS

| | | | |
|---|---|---|---|
| 2012/0021707 A1* | 1/2012 | Forrester ............... | H04W 52/30 455/115.3 |
| 2014/0273819 A1 | 9/2014 | Nadakuduti et al. | |

(Continued)

FOREIGN PATENT DOCUMENTS

| | | |
|---|---|---|
| CN | 108040345 A | 5/2018 |
| CN | 109327235 A | 2/2019 |

(Continued)

OTHER PUBLICATIONS

Dinh et al., "Experimental Validations on Low-Error Estimation Models in Determining the Maximum Specific Absorption Rate of Multi-Antenna Mobile Handsets" Published in: 2019 IEEE VTS Asia Pacific Wireless Communications Symposium (APWCS), published in EMC Lab, National Institute of Information and Communications Technology, 5 pages.

(Continued)

*Primary Examiner* — Ajibola A Akinyemi
(74) *Attorney, Agent, or Firm* — DITTHAVONG, STEINER & MLOTKOWSKI

(57) ABSTRACT

The invention relates to a method for measuring the specific absorption rate SAR of a mobile device under test DUT enabled for a combined LTE RF and 5G RF transmission, the method comprising the following steps: a.) Providing a mobile device under test DUT operable in LTE RF and 5G standard, b.) Setting the DUT in a mode to transmit with maximum power level according to the 5G standard, and at the same time transmitting with lower power level of LTE RF standard, c.) Performing a SAR scan and measuring the 5G signal, without taking into account any contribution from the LTE RF signal, d.) Setting the DUT in a mode to transmit with maximum power at maximum power in LTE RF standard, without transmitting according to the 5G standard, e.) Performing a SAR scan and measuring the LTE RF (Continued)

standard signal, f.) Combining the results of step c.) and e.) in order obtain a combined SAR value.

7 Claims, 3 Drawing Sheets

(58) Field of Classification Search
CPC .. H04B 7/0404; H04B 7/0805; H04B 7/0834;
H04B 1/3838; H04B 17/24; H04B 1/12;
H04B 1/123; H04B 15/00; H04B
17/3912; H04B 7/0408; H04B 7/0619;
H04B 7/0695; H04B 1/3805; H04B
1/385; H04B 17/382
USPC ...................................................... 455/67.11
See application file for complete search history.

(56) References Cited

U.S. PATENT DOCUMENTS

2020/0015171 A1* 1/2020 Nadakuduti ......... H04B 1/3838
2020/0413386 A1* 12/2020 Feng ................... H04W 52/146

FOREIGN PATENT DOCUMENTS

| CN | 109587779 A | 4/2019 |
| CN | 109714488 A | 5/2019 |
| EP | 1916531 A1 | 4/2008 |
| WO | 2011111049 A1 | 9/2011 |

OTHER PUBLICATIONS

Dinh et al., "A New Measurement Technique to Determine the Maximum SAR of Multiple-Antenna Transmitters Using K-Order Models and Scalar E-Field Probes ", Published in 2019 26th International Conference on Telecommunications (ICT), 5 pages.

Takahiro et al., "SAR Measurement Procedure for Multi-antenna Transmitters", published in Research Laboratories, NTT Docomo, Inc., 2009, 4 pages.

Martin et al.. "A SAR test procedure for wireless devices with simultaneous multi-band transmission", Published in IEEE Antennas and Propagation Society International Symposium. Digest. Held in conjunction with: USNC/CNC/URSI North American Radio Sci. Meeting (Cat. No. 03CH37450), 2003, 4 pages.

* cited by examiner

SAR MEASUREMENT FOR A COMBINED 5G AND LTE RF DEVICE

PRIORITY

This application claims priority of European patent application EP 19 197 946.7 filed on Sep. 18, 2019, which is incorporated by reference herewith.

TECHNICAL FIELD OF THE INVENTION

The present invention generally is in the field of measuring specific absorption rates SAR.

BACKGROUND OF THE INVENTION

SAR is a measure of the rate of RF (radiofrequency) energy absorption by a human body from a mobile device under test such as e.g. a cell phone. The SAR measurement is carried out following defined protocols, such as e.g.:

IEC 62209-1 Ed. 2.0: Human exposure to radio frequency fields from hand-held and body-mounted wireless communications devices—human models, instrumentation and procedures—Part 1: Procedure to determine the specific absorption rate (SAR) for hand-held devices used in close proximity to the ear (frequency range of 300 MHz to 3 GHz);

IEC 62209-2 Ed. 1.0: Human exposure to radio frequency fields from hand-held and body-mounted wireless communications devices—human models, instrumentation and procedures—Part 2: Procedure to determine the specific absorption rate (SAR) for wireless communication devices used in close proximity to the human body (frequency range of 30 MHz to 6 GHz); and IEC 62209-2:2010 is applicable to any wireless communication device capable of transmitting electromagnetic fields (EMF) intended to be used at a position near the human body, in the manner described by the manufacturer, with the radiating part(s) of the device at distances up to and including 200 mm from a human body, i.e. when held in the hand or in front of the face, mounted on the body, combined with other transmitting or non-transmitting devices or accessories (e.g. belt-clip, camera or Bluetooth add-on), or embedded in garments. For transmitters used in close proximity to the human ear, the procedures of IEC 62209-1:2005 are applicable. IEC 62209-2:2010 is applicable for radio frequency exposure in the frequency range of 30 MHz to 6 GHz, and may be used to measure simultaneous exposures from multiple radio sources used in close proximity to human body. Definitions and evaluation procedures are provided for the following general categories of device types body-mounted, body-supported, desktop, front-of-face, hand-held, laptop, limb-mounted, multi-band, push-to-talk, and clothing-integrated. The types of devices considered include but are not limited to mobile telephones, cordless microphones, auxiliary broadcast devices and radio transmitters in personal computers. IEC 62209-2:2010 gives guidelines for a reproducible and conservative measurement methodology for determining the compliance of wireless devices with the SAR limits.

The initial launch of 5G new radio (NR) is expected to be mostly based on operations in the non-standalone (NSA) mode. 5G NR NSA requires LTE as an anchor to support NR signaling and control, and 5G NR is mainly used for high speed user data transmission.

As an interim step for 5G NR deployments, 3GPP has specified the non-standalone configurations, using dual connectivity (DC) between the UE and both an NR base station (gNB-5G) and LTE base station (eNB-4G). The EPC core network is connected to the eNB. All control-plane functions are handled by LTE, and NR is used only for data in the user-plane. 5G is activated only when higher data rates are needed.

The initial deployment of NR is expected to be mainly in TDD mode to optimize throughput. 3GPP Rel. 15 has no limitation for uplink/downlink transmission duty cycle, although some deployments may limit the TDD DL:UL transmission ratio to lower values (e.g., 25-30%). The transmission duty factor required to perform SAR measurements should be determined according to the operating characteristics and capabilities of the individual products. Provided a device is able to support 100% duty factor in the uplink, all SAR measurements should be performed at 100% duty factor. In special cases where the DUT hardware does not support 100% duty cycle, testing at the maximum possible duty cycle is required. 3GPP Rel. 15 has specified that CP-OFDM and DFTS-OFDM are the OFDM waveforms supported by 5G NR. Besides maximum output power, signal modulations for the sub-carriers, aggregated channel bandwidth, resource block (RB) configurations and maximum power reduction (MPR) etc. can influence the PAPR (peak to average power ratio) of NR signals, which would need consideration to determine the applicable wireless modes required for SAR measurement.

Until call box support is available, 5G product manufacturers would need to provide NR test mode support for SAR measurements. The wireless transmission configurations used in test modes should be equivalent to those required for compliance testing by regulatory authorities; for example, channel bandwidth, sub-carrier spacing, RB allocation configurations etc. Whether the DL:UL configurations for TDD is static or dynamic, the highest transmission duty factor will need consideration according to product capabilities to determine the appropriate test configurations.

Thus, there is a need to provide for an improved method for SAR measurement for a combined 5G and LTE RF device.

SUMMARY OF THE INVENTION

The object of the present invention is achieved by the solution provided in the enclosed independent claims. Advantageous implementations of the present invention are further defined in the dependent claims.

According to a first aspect, the invention relates to a method for measuring the specific absorption rate SAR of a mobile device under test DUT enabled for a combined LTE RF and 5G RF transmission, the method comprising the following steps a.) Providing a mobile device under test DUT operable in LTE RF and 5G standard, b.) Setting the DUT in a mode to transmit with maximum power level according to the 5G standard, and at the same time transmitting with lower power level (in relation to the 5G standard transmission) of LTE RF standard, c.) Performing a SAR scan and measuring the 5G signal, without taking into account any contribution from the LTE RF signal, d.) Setting the DUT in a mode to transmit with maximum power at maximum power in LTE RF standard, without transmitting according to the 5G standard, e.) Performing a SAR scan and measuring the LTE RF standard signal, f.) Combining the results of step c.) and e.) in order obtain a combined SAR value for LTE and 5G.

This provides the advantage that a simple method is provided in order to measure SAR values.

In an embodiment of the method of the first aspect, the 5G standard is a 5G NR NSA mode with LTE RF as anchor.

This provides the advantage that well known standards and modes are used in order to perform the measurement of SAR values.

In a further embodiment of the method of the first aspect, in step b.) the DTU is made to establish a link in 5G standard with a communication tester base station, wherein all data transfer is conducted in 5 G standard, and all non-data transfer, such as signaling and synchronization, is conducted in LTE RF standard.

In a further embodiment of the method of the first aspect, in step b.) the LTE RF standard transmission is conducted at minimum power level required for maintaining the LTE RF link.

In a further embodiment of the method of the first aspect, in step b.) the LTE RF standard transmission is conducted at a power level at least 10 dB, preferably at least 20 dB, more preferred at least 30 dB lower than the power level of the LTE RF standard transmission.

In a further embodiment of the method of the first aspect, in steps c.) and e.) diode-based detector probes are used.

This provides the advantage that well known detector probes are used in order to provide SAR values.

According to a second aspect, the invention relates to a program of instructions storable on a computer readable medium for causing a computer to execute steps of the method according to the first aspect or any one of the implementation forms thereof.

BRIEF DESCRIPTION OF THE DRAWINGS

The invention will be explained in the followings together with the figures.

DETAILED DESCRIPTION OF THE PREFERRED EMBODIMENTS

Figure 1:
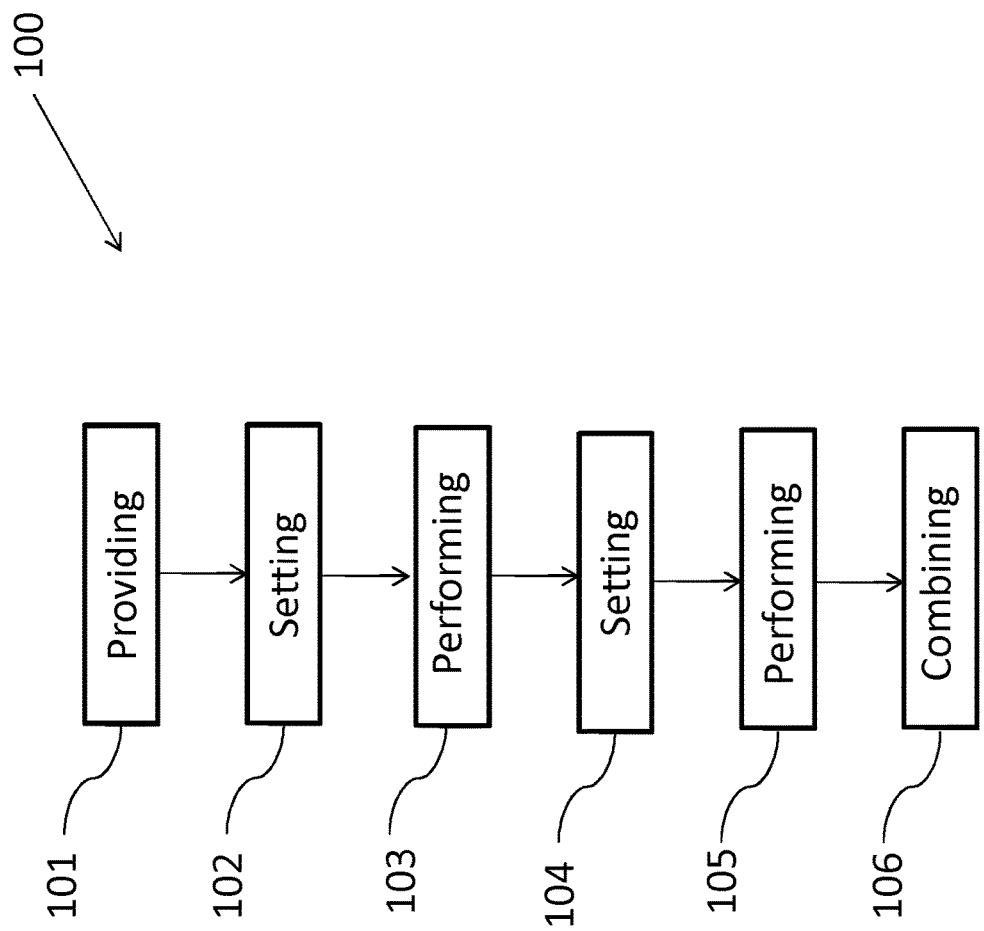
FIG. 1 shows an embodiment of a method for measuring the specific absorption rate SAR of a mobile device under test according to the invention.

Aspects of the present invention are described herein in the context of a method for measuring the specific absorption rate SAR of a mobile device under test.

The present invention is described more fully hereinafter with reference to the accompanying drawings, in which various aspects of the present invention are shown. This invention however may be embodied in many different forms and should not be construed as limited to the various aspects of the present invention presented through this disclosure. Rather, these aspects are provided so that this disclosure will be thorough and complete, and will fully convey the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus.

Various aspects of a method for measuring the specific absorption rate SAR of a mobile device under test will be presented. However, as those skilled in the art will readily appreciate, these aspects may be extended to aspects of methods for measuring the specific absorption rate SAR of a mobile device under test without departing from the invention.

Now referring to FIG. 1, a method 100 for measuring the specific absorption rate SAR of a mobile device under test DUT is shown according to an embodiment, wherein the mobile device under test DUT is enabled for a combined LTE RF and 5G RF transmission.

The method 100 comprises the following steps:
a.) Providing 101 the mobile device under test DUT operable in LTE RF and 5G standard;
b.) Setting 102 the DUT in a mode to transmit with maximum power level according to the 5G standard, and at the same time transmitting with lower power level of LTE RF standard;
c.) Performing 103 a SAR scan and measuring the 5G signal, without taking into account any contribution from the LTE RF signal;
d.) Setting 104 the DUT in a mode to transmit with maximum power at maximum power in LTE RF standard, without transmitting according to the 5G standard;
e.) Performing 105 a SAR scan and measuring the LTE RF standard signal; and
f.) Combining 106 the results of step c.) and e.) in order obtain a combined SAR value.

In one embodiment, due to the operating flexibility introduced by 5G NR and certain specific requirements described above for NSA, independent exposure testing of LTE and NR is suitable to overcome SAR measurement difficulties and to simplify testing considerations. By keeping the 4G LTE and 5G NR SAR measurements separate, the independently evaluated SAR can be scaled according to the operating parameters specific for each wireless technology to accommodate the diverse flexibility supported by 5G NR; for example, simultaneous transmission of different technologies (NR, LTE, Wi-Fi and Bluetooth). When different transmission duty factors or maximum output power may be applicable to a NR configuration (signal modulation, channel bandwidth and RB allocations in a frequency band), the SAR results may be scaled according to output power and transmission duty factor.

Figure 2:
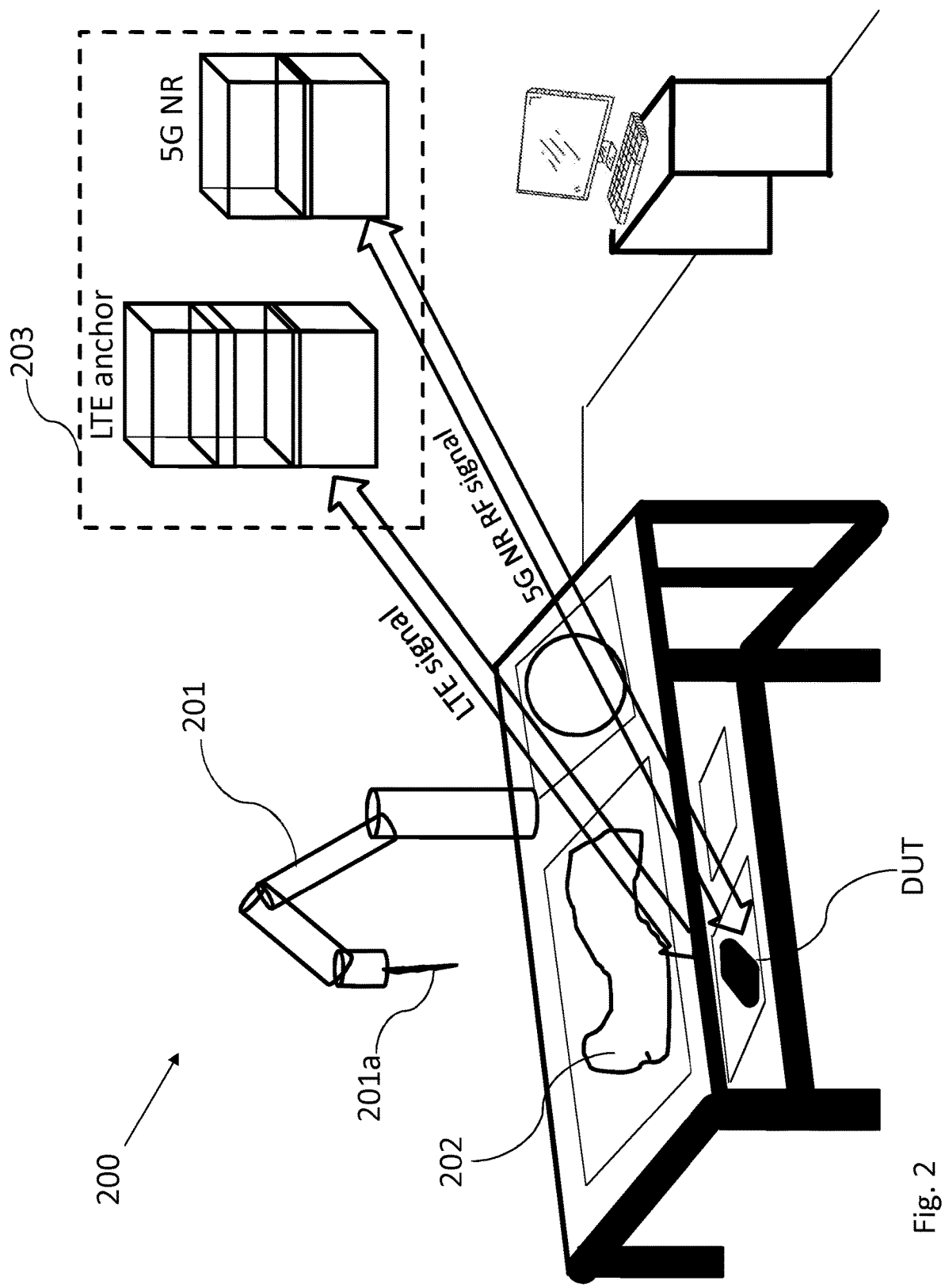
FIG. 2 shows an experimental setup for performing a method for measuring the specific absorption rate SAR of a mobile device under test according to an embodiment.

FIG. 2 shows an experimental setup 200 for performing a method 100 for measuring the specific absorption rate SAR of a mobile device under test DUT according to an embodiment.

As mentioned in the background of the invention, evaluation of compliance of wireless devices with respect to regulatory exposure limits is typically done according to IEC 62209-1/-2/-3 standards, IEEE 1528 or IEC/IEEE 63195. At frequencies below 10 GHz, the Specific Absorption Rate (SAR) is the measured quantity. At frequencies above 10 GHz, the relevant metric is the near-field power density (PD).

Reference compliance measurement systems for both quantities are typically made of a 6-axis robot 201 moving a diode-detected probe 201a on a defined grid, in order to measure at least the electric field magnitude in two or three components in the DUT near-field. In the case of SAR, the probe is moved in mannequins 202 which reproduce dielectric properties within the same range as a human head or body. For PD, measurements are done in air.

Diode-detected probes 201a do not discriminate between different energetic contributions at different frequencies or coming from different communication standards. This can be problematic in the case of 5G NR NSA modes, where the LTE link and the 5G NR transmission happen in parallel. Indeed diode-detected probes 201a are normally calibrated for each frequency or frequency band by interval of 100 MHz, as well as for each signal type (e.g. modulation, resource block allocation, etc. . . . ). When the probe 201a integrates the two signals transmitted simultaneously, their contributions are mixed together and the absence of phase information makes it difficult to then apply the correct probe calibration coefficients.

In one embodiment, RF probes are used with spectral analysis instead of diode-detected probes.

Embodiments of the present invention apply to diode-detected probes 201a which are considered as the reference in human exposure measurements due to their very small size and metal content (low RF impact when used in near proximity from the DUT) and accurate and traceable calibration.

During a near-field exposure measurement, as shown in FIG. 2, the following steps can be performed:
1. The device DUT is placed in close proximity to head or body mannequin 202 for measurements below 10 GHz (in air for measurements above);
2. The DUT is set to transmit at maximum power in a variety of test modes for which the SAR (below 10 GHz) or NF power density (above 10 GHz) are measured. The DUT is controlled via a BTS 203;
3. Typically, the 6-axis robot moves the diode-detected probe 201a in the mannequin 202 which contain tissue-simulating fluids;
4. Supposing the DUT transmits in 5G NR NSA, a 5G NR signal and a LTE link signal are mixed in the transmission;
5. Diode-detected probes 201a require calibration for frequencies typically spaced by 100 MHz and for all types of signal waveforms; and
6. When two signals are mixed like in 5G NR NSA, the diode delivers a voltage which cannot be easily related to the electric field as LTE and 5G NR may not be separated after detection, and correct calibration coefficients can hence not be applied.

In embodiments of the invention, the DUT is supposed to operate at 5G NR NSA mode. The BTS 203 controls the DUT so that the LTE RF signal transmitted is put at minimum without losing the link. Typically, it is set to be at least 10 dBm below the 5G NR DUT RF signal. In this way, the measured SAR is not significantly affected by the LTE signal, and hence correct 5G NR diode calibration coefficient can be applied. The influence of the LTE can be accounted as an uncertainty.

In the following some steps of the method 100 for determining the SAR value in 5G NSA are given:
1) establish a link between the DUT and the communication tester in 5G NR NSA-mode, i.e. data transfer is conducted in 5G, while all non-data transfers are conducted in LTE;
2) the LTE link is forced by the communication tester at a power lower than the 5G NR; and
3) perform SAR measurement.

The LTE link is forced by the communication tester at a power lower than the 5G NR by at least 10 dB, 20 dB, etc.

LTE SAR can be assessed separately, without 5G connection, i.e. SA LTE. A combination between LTE SA SAR and 5G NSA LTE SAR (with low power in LTE) can take place as well and the worst case exposure corresponds to the case with strong LTE and strong 5G.

Figure 3:
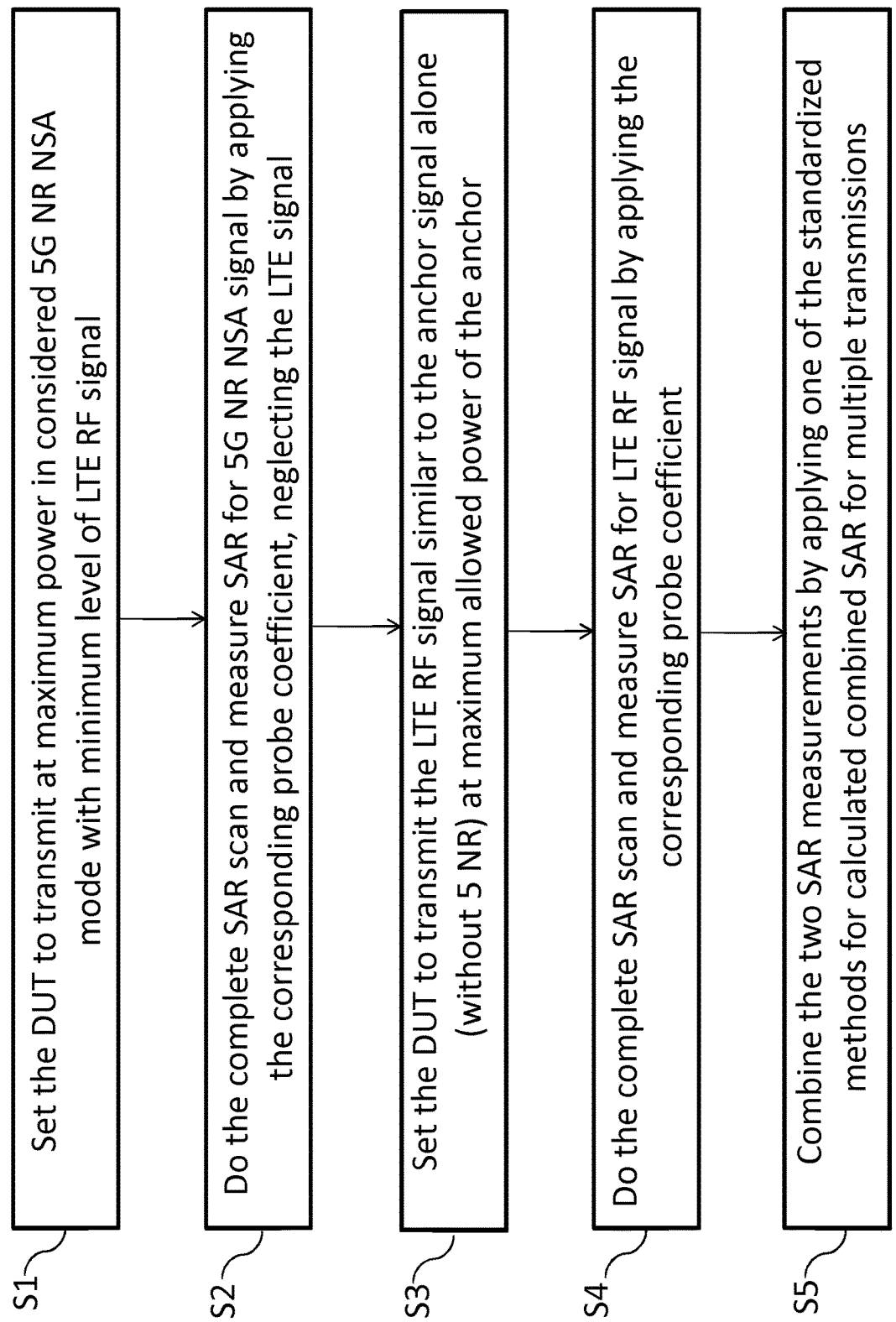
FIG. 3 shows an embodiment of a method for measuring the specific absorption rate SAR of a mobile device under test according to the invention.

FIG. 3 shows an embodiment of the method 100 for measuring the specific absorption rate SAR of the mobile device under test DUT according to the invention.

The method 100 further comprises the following steps:
Set S1 the DUT to transmit at maximum power in considered 5G NR NSA mode with minimum level of LTE RF signal;
Do S2 the complete SAR scan and measure SAR for 5G NR NSA signal by applying the corresponding probe coefficient for 5G NR, neglecting the LTE signal;
Set S3 the DUT to transmit the LTE RF signal similar to the anchor signal alone (without 5 NR) at maximum allowed power of the anchor;
Do S4 the complete SAR scan and measure SAR for LTE RF signal by applying the corresponding probe coefficient for LTE RF; and
Combine S5 the two SAR measurements by applying one of the standardized methods for calculated combined SAR for multiple transmissions.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit of scope of the invention. Thus, the breadth and scope of the present invention should not be limited by any of the above-described embodiments. Rather, the scope of the invention should be defined in accordance with the following claims and their equivalence.

Although the invention has been illustrated and described with respect to one or more implementations, equivalent alternations and modifications will occur to those skilled in the art upon the reading of the understanding of the specification and the annexed drawings. In addition, while a particular feature of the invention may have been disclosed with respect to only of the several implementations, such features may be combined with one or more other features of the other implementations as may be desired and advantage for any given or particular application.

What is claimed is:

1. A method for measuring the specific absorption rate SAR of a mobile device under test (DUT) enabled for a combined LTE RF and 5G RF transmission, the method comprising the following steps:
   a) providing a mobile device under test (DUT) operable in LTE RF and 5G standard,
   b) setting the (DUT) in a mode to transmit with maximum power level according to the 5G standard, and at the same time transmitting with lower power level of LTE RF standard,
   c) performing a SAR scan and measuring the 5G signal, without taking into account any contribution from the LTE RF signal,
   d) setting the (DUT) in a mode to transmit with maximum power at maximum power in LTE RF standard, without transmitting according to the 5G standard,
   e) performing a SAR scan and measuring the LTE RF standard signal, and
   f) combining the results of step c.) and e.) in order obtain a combined SAR value.

2. The method of claim 1,
   wherein the 5G standard is a 5G NR NSA mode.

3. The method of claim 1,
wherein in step b) the DTU is made to establish a link in 5G standard with a communication tester base station,
wherein all data transfer is conducted in 5 G standard, and all non-data transfer, such as signaling and synchronization, is conducted in LTE RF standard.

4. The method according to claim 1,
wherein in step b) the LTE RF standard transmission is conducted at minimum power level required for maintaining the LTE RF link.

5. The method according to claim 1,
wherein in step b) the LTE RF standard transmission is conducted at a power level at least 10 dB, preferably at least 20 dB, more preferred at least 30 dB lower than the power level of the LTE RF standard transmission.

6. The method according to claim 1,
wherein in steps c) and e) diode-based detector probes are used.

7. A program of instructions stored on a non-transitory computer readable medium for causing a computer to execute steps of the method according to claim 1.

* * * * *